(12) United States Patent
Lee et al.

(10) Patent No.: US 10,635,775 B2
(45) Date of Patent: Apr. 28, 2020

(54) INTEGRATED CIRCUIT INCLUDING FILLER CELL

(71) Applicant: Samsung Electronics Co., Ltd., Suwon-si, Gyeonggi-do (KR)

(72) Inventors: Hoi-jin Lee, Seoul (KR); Kyoung-kuk Chae, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 147 days.

(21) Appl. No.: 15/869,486

(22) Filed: Jan. 12, 2018

(65) Prior Publication Data

US 2019/0012423 A1 Jan. 10, 2019

(30) Foreign Application Priority Data

Jul. 4, 2017 (KR) .................. 10-2017-0084988

(51) Int. Cl.
| | | |
|---|---|---|
| *G06F 17/50* | (2006.01) | |
| *H01L 27/02* | (2006.01) | |
| *H01L 27/118* | (2006.01) | |
| *H01L 27/092* | (2006.01) | |
| *H01L 27/12* | (2006.01) | |

(52) U.S. Cl.
CPC ...... *G06F 17/5081* (2013.01); *G06F 17/5072* (2013.01); *G06F 17/5077* (2013.01); *H01L 27/0207* (2013.01); *H01L 27/0924* (2013.01); *H01L 27/11807* (2013.01); *H01L 27/1211* (2013.01); *H01L 2027/11874* (2013.01)

(58) Field of Classification Search
CPC . H01L 23/295; H01L 23/49838; H01L 29/78; H01L 29/7811; H01L 2027/11874; G06F 17/5072; G06F 17/5068; G06F 17/5081; G06F 2217/06; G06F 17/5045; G06F 17/505
USPC .................. 716/108, 114, 118–119, 132–135
See application file for complete search history.

(56) References Cited

U.S. PATENT DOCUMENTS

| | | | |
|---|---|---|---|
| 7,368,767 B2 | 5/2008 | Kinoshita et al. | |
| 7,808,051 B2 | 10/2010 | Hou et al. | |
| 8,136,072 B2 | 3/2012 | Frederick | |
| 8,239,799 B2 | 8/2012 | Riviere-Cazaux | |

(Continued)

FOREIGN PATENT DOCUMENTS

| | | |
|---|---|---|
| CN | 103811487 A | 5/2014 |
| KR | 10-2017-0127340 A | 11/2017 |

*Primary Examiner* — Nghia M Doan
(74) *Attorney, Agent, or Firm* — Harness, Dickey & Pierce, P.L.C.

(57) ABSTRACT

Provided is an integrated circuit. The integrated circuit includes: a first standard cell comprising a P-type Fin Field Effect Transistor (FinFET) region and an N-type FinFET region; and a filler cell adjacent to the first standard cell in a first direction and including a first region and a second region arranged in a second direction perpendicular to the first direction, wherein the first region includes a plurality of first insulating structures spaced apart from each other in the first direction, and the second region includes a second insulating structure having a width greater than that of at least one of the plurality of first insulating structures in the first direction, and one of the first region and the second region is arranged adjacent to the P-type FinFET region in the first direction and the other is arranged adjacent to the N-type FinFET region in the first direction.

20 Claims, 10 Drawing Sheets

(56) References Cited

U.S. PATENT DOCUMENTS

| | | |
|---|---|---|
| 10,050,028 B2 * | 8/2018 | Peng .................... G06F 17/5072 |
| 2013/0332893 A1 | 12/2013 | Lin et al. |
| 2014/0167815 A1 | 6/2014 | Penzes |
| 2016/0110489 A1 * | 4/2016 | Schroeder ........... G06F 17/5072 716/119 |
| 2016/0292341 A1 | 10/2016 | Sukharev et al. |
| 2017/0329885 A1 * | 11/2017 | Chae .................... G06F 17/5072 |
| 2017/0371994 A1 * | 12/2017 | Bowers ............... G06F 17/5072 |

* cited by examiner

US 10,635,775 B2

INTEGRATED CIRCUIT INCLUDING FILLER CELL

CROSS-REFERENCE TO RELATED APPLICATION

This application claims the benefit of Korean Patent Application No. 10-2017-0084988, filed on Jul. 4, 2017, in the Korean Intellectual Property Office, the disclosure of which is incorporated herein in its entirety by reference.

BACKGROUND

Example embodiments of the inventive concepts relate to an integrated circuit. For example, at least some example embodiments relate to an integrated circuit including a filler cell.

As semiconductor devices become highly integrated, it may become increasingly difficult to realize transistor performance required by users. In order to overcome such technical difficulties, various field-effect transistor structures such as a Fin Field Effect Transistor (FinFET) have been proposed. Meanwhile, in order to achieve two competing goals of high-performance and low-power in a trade-off relationship, there may be a desire to control the speed of a cell including a transistor such as a FinFET.

SUMMARY

Example embodiments of the inventive concepts provide an integrated circuit for regulating performance of a transistor through a filler cell.

According to an example embodiment of the inventive concepts, an integrated circuit may include: a first standard cell including a P-type Fin Field Effect Transistor (FinFET) region and an N-type FinFET region; and a filler cell adjacent to the first standard cell in a first direction, the filler cell including a first region and a second region arranged in a second direction, the second direction being perpendicular to the first direction, a first one of the first region and the second region being adjacent to the P-type FinFET region in the first direction and a second one of the first region and the second region being adjacent to the N-type FinFET region in the first direction, the first region including a plurality of first insulating structures spaced apart from each other in the first direction, and the second region includes a second insulating structure, a width of the second insulating structure in the first direction being greater than a width at least one of the plurality of first insulating structures in the first direction.

According to another example embodiment of the inventive concepts, an integrated circuit may include: a first standard cell including a P-type Fin Field Effect Transistor (FinFET) region and an N-type FinFET region; and a filler cell adjacent to the first standard cell in a first direction, the filler cell including a first region and a second region arranged in a second direction, the second direction being perpendicular to the first direction, a first one of the first region and the second region including a diffusion region.

According to another example embodiment of the inventive concepts, an integrated circuit may include: a first cell including a first diffusion region, a second diffusion region and a plurality of gate patterns, the first diffusion region and the second diffusion region extending in a first direction, the second diffusion region being spaced apart from the first diffusion region in a second direction, the second direction being perpendicular to the first direction, the plurality of gate patterns extending in the second direction across the first diffusion region and the second diffusion region; and a filler cell adjacent to the first cell in the first direction, the filler cell including a first region and a second region arranged along the second direction, the first region including a plurality of first insulating structures spaced apart from each other in the first direction, and the second region including a second insulating structure, a width of the second insulating structure being greater than a width of at least one of the plurality of first insulating structures.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
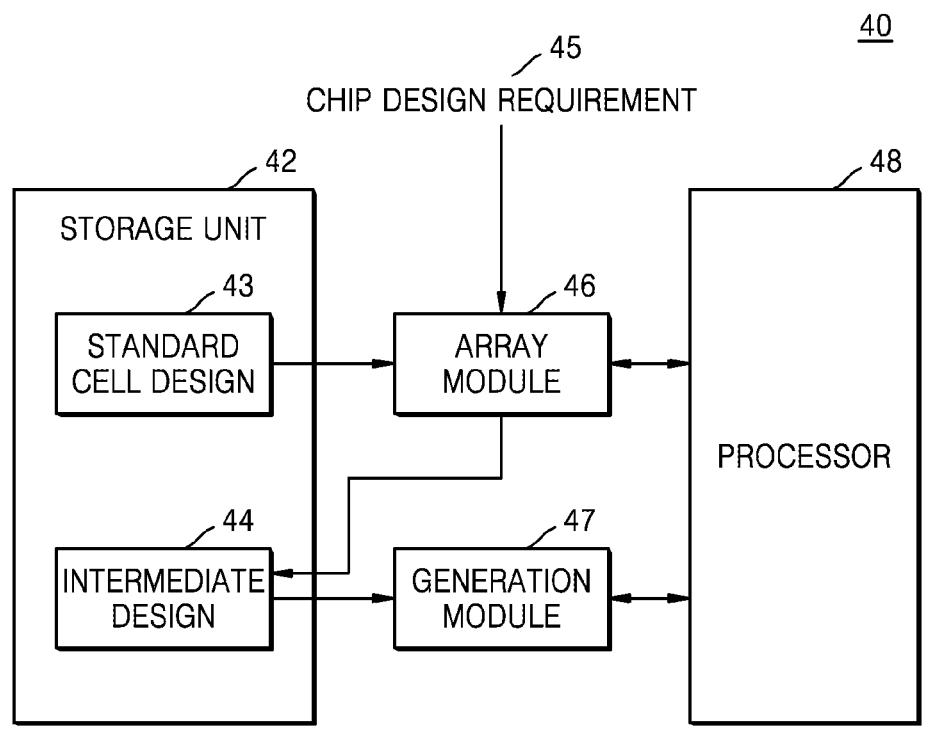
FIG. 1 is a block diagram of a layout design according to an example embodiment of the inventive concepts.

FIG. 1 is a block diagram of a layout design according to an example embodiment of the inventive concepts.

Referring to FIG. 1, a layout design section 40 includes a storage unit 42, an array module 46, a generation module 47, and a processor 48.

A standard cell design 43 may be stored in the storage unit 42. For example, when a device is a Static Random Access Memory (SRAM) device or a logic device, a standard cell constituting the device may be an inverter cell.

Meanwhile, the standard cell design 43 may include a layout capable of manufacturing such a standard cell. For example, the standard cell design 43 may include a diffusion region and a gate region disposed on the diffusion region. The diffusion region may be referred to as an active region.

Although one standard cell design 43 is shown in FIG. 1 as being stored in the storage unit 42, example embodiment of the inventive concepts are not limited thereto. For example, in some example embodiments of the inventive concepts, the storage unit 42 may store a plurality of standard cell designs 43 that constitute one block, device, or chip. That is, the plurality of standard cell designs 43 may be stored in the storage unit 42 in the form of a library.

The standard cell design 43 may be input to the array module 46. The array module 46 may use the processor 48 to arrange the plurality of standard cell designs 43 according to a chip design requirement 45 to generate an intermediate design 44. The generated intermediate design 44 may be stored in the storage unit 42.

Meanwhile, the chip design requirement 45 provided to the array module 46 may be input from a user or the like, or may be stored in the storage unit 42 in advance. For example, the array module 46 may be implemented in software, but is not limited thereto.

The storage unit 42, which stores the standard cell design 43 and/or the intermediate design 44, may be configured, for example, as a nonvolatile memory device. Examples of such a nonvolatile memory device include NAND flash, NOR flash, magnetic random-access memory (MRAM), phase-change RAM (PRAM), resistive RAM (RRAM), and the like. However, example embodiments of the inventive concepts are not limited thereto, and the storage unit 42 may be a hard disk drive (HDD), a magnetic memory device, or the like.

In an example embodiment, the intermediate design 44 is disposed adjacent to the standard cell design 43 and may include a filler design including a first region including a plurality of first insulating structures and a second insulating structure having a width greater than that of the first insulating structure. A detailed description thereof will be provided later below.

The intermediate design 44 may be input to the generation module 47. The generation module 47 may use the processor 48 to create a design element in the intermediate design 44. For example, the design element generated by the generation module 47 may be a diffusion region, a dummy gate region, or the like.

In an example embodiment of the inventive concepts, the generation module 47 may generate a first region including a plurality of first insulating structures and a second region including a second insulating structure having a width greater than that of the first insulating structure in a filler cell design disposed adjacent the standard cell design 43 included in the intermediate design 44. For example, the generation module 47 may be implemented in software, but is not limited thereto.

Meanwhile, for example, when the array module 46 and the generation module 47 are implemented in software, the array module 46 and the generation module 47 may be stored in the storage unit 42 in a code form or may be stored in another storage unit (not shown) separate from the storage unit in a code form.

The processor 48 may be used to perform operations of the array module 46 and the generation module 47. Although only one processor 48 is shown in FIG. 1, a plurality of processors 48 may be arranged. In other words, the layout design section 40 may be deformed in any way as being driven in a multi-core environment.

Although FIG. 1 shows that the layout design section 40 disposes the standard cell design 43 according to the chip design requirement 45, example embodiments of the inventive concepts are not limited thereto. For example, the layout design section 40 may be deformed to dispose the standard cell design 43 according to a block design requirement (not shown).

Figure 2:
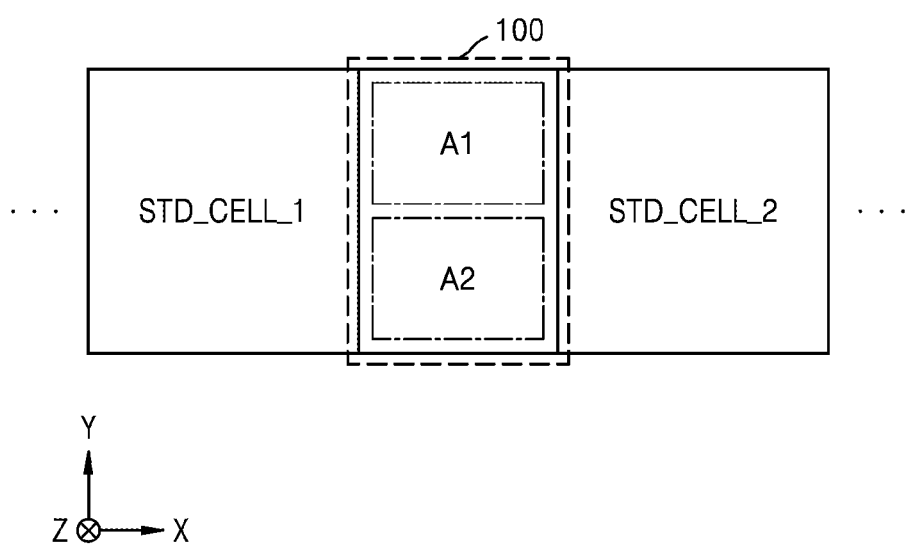
FIG. 2 is a layout of an integrated circuit according to an example embodiment of the inventive concepts.

FIG. 2 is a layout of an integrated circuit according to an example embodiment of the inventive concepts.

Referring to FIG. 2, FIG. 2 may be a layout for a portion of the intermediate design 44 shown in FIG. 1. However, example embodiments are not limited thereto.

FIG. 2 shows a first standard cell STD_CELL_1, a second standard cell STD_CELL_2, and a filler cell 100. The first standard cell STD_CELL_1 and the second standard cell STD_CELL_2 may be spaced apart from each other in a first direction X. The first standard cell STD_CELL_1 and/or the second standard cell STD_CELL_2 may be, for example, an inverter.

In an example embodiment, the first standard cell STD_CELL_1 and/or the second standard cell STD_CELL_2 may include a first diffusion region and a second diffusion region spaced apart from each other in a second direction Y. In addition, the first standard cell STD_CELL_1 and/or the second standard cell STD_CELL_2 may include a plurality of gate patterns extending in the second direction Y across the first diffusion region and the second diffusion region.

The filler cell 100 may provide electrical insulation between the first standard cell STD_CELL_1 and the second standard cell STD_CELL_2. Furthermore, in an example embodiment of the inventive concepts, the filler cell 100 may provide a compressive or tensile stress to the first standard cell STD_CELL_1 and/or the second standard cell STD_CELL_2. A detailed description thereof will be described later below.

The filler cell 100 may include a first region A1 and a second region A2. The first region A1 and the second region A2 may be arranged along the second direction Y. According to an example embodiment, the arrangement of the first region A1 and the second region A2 may be mutually reversed. In an example embodiment, one of the first region A1 and the second region A2 may alternatively include a diffusion region.

In an example embodiment, the first region A1 may include a plurality of first insulating structures spaced apart from each other in the first direction X. Also, in an example embodiment, the second region A2 may include a second insulating structure having a width, in the first direction X, greater than that of at least one of the plurality of first insulating structures included in the first region A1.

For convenience of explanation, FIG. 2 shows that the first standard cell STD_CELL_1 is disposed adjacent to the filler cell 100 in the first direction X, and the second standard cell STD_CELL_2 is also disposed adjacent to the filler cell 100 in the first direction X, but example embodiment of the inventive concepts are not limited thereto. That is, the first standard cell STD_CELL_1 or the second standard cell STD_CELL_2 may be disposed adjacent to the filler cell 100 in the second direction Y.

Figure 3A:
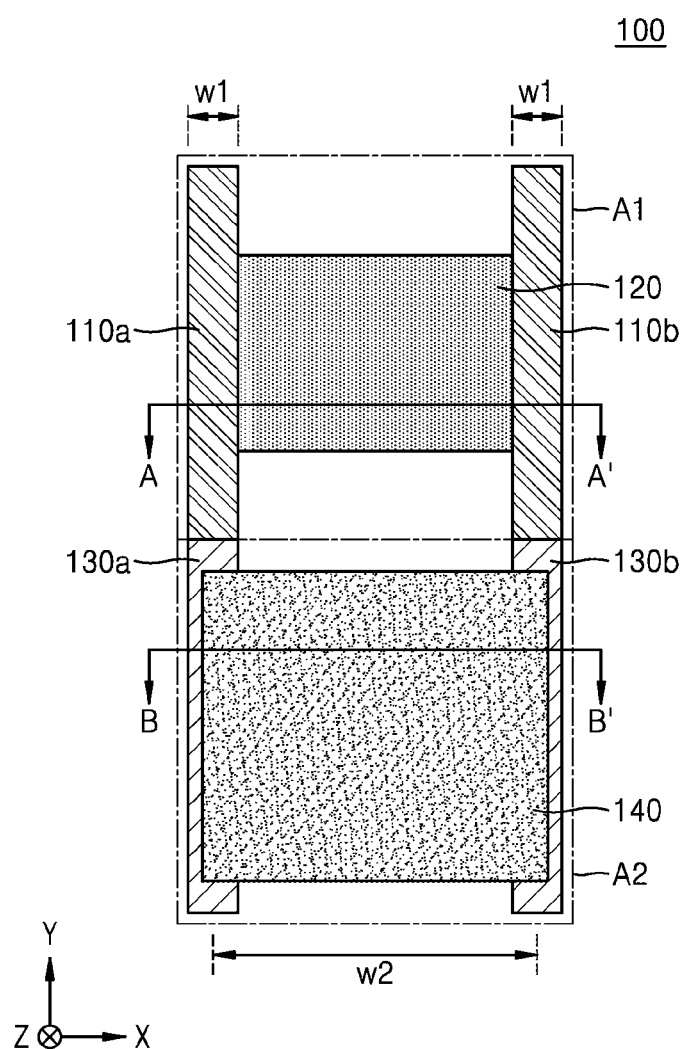
FIGS. 3A to 3D are views of structures of a filler cell according to an example embodiment of the inventive concepts.
Figure 3B:
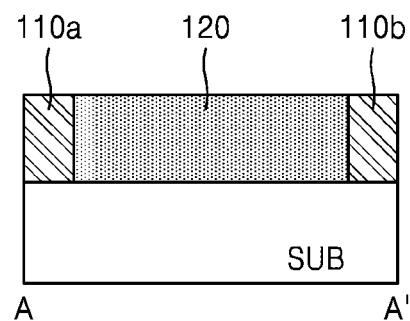
Figure 3C:
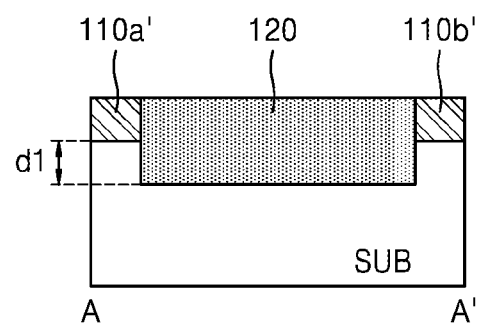
Figure 3D:
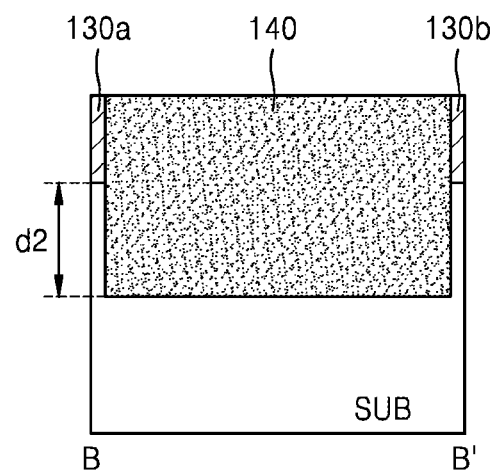

FIGS. 3A to 3D are views of structures of a filler cell according to an example embodiment of the inventive concepts. In more detail, FIG. 3A shows a layout of the filler cell 100, FIG. 3B and FIG. 3C show cross-sections taken along a line A-A' of the filler cell 100, and FIG. 3D shows a cross-section taken along a line B-B' of the filler cell 100.

Referring to FIG. 3A, the first region A1 of the filler cell 100 may include first insulating structures 110*a* and 110*b* and a diffusion region 120. In addition, the second region A2 may include gate patterns 130*a* and 130*b* and a second insulating structure 140.

The first insulating structures 110*a* and 110*b* may be spaced apart from each other in the first direction X. The first insulating structures 110*a* and 110*b* may be formed by, for example, forming a trench in a semiconductor substrate or a diffusion region formed in the semiconductor substrate, and then filling the trench with an insulating material. The first insulating structures 110a and 110b may be referred to, for example, as a single diffusion break. Although not shown, a dummy gate layer may be formed on an upper surface of the first insulating structures 110a and 110b. The first insulating structures 110a and 110b may have a first width w1 in the first direction X, respectively. However, example embodiments of the inventive concepts are not limited thereto, and widths of the first insulating structures 110a and 110b may be different from each other.

The diffusion region 120 may be located between the first insulating structures 110a and 110b. A length of the diffusion region 120 in the second direction Y may be shorter than those of the first insulating structures 110a and 110b in the second direction Y. Although not shown, a fin extending in the first direction X may be disposed in the diffusion region 120. For example, the fin may have a rectangular parallelepiped shape. As another example, corners of the fin may be rounded.

Referring to FIG. 3B, the first insulating structures 110a and 110b and the diffusion region 120 may be arranged on a substrate SUB. The substrate SUB may be a semiconductor substrate, wherein the semiconductor substrate may include, for example, any one of a Silicon-On-Insulator (SOI), a Silicon-On-Sapphire (SiON), germanium, silicon-germanium, and gallium-arsenide.

An upper surface of the diffusion region 120 may be flush with the upper surface of the first insulating structures 110a and 110b. In addition, a lower surface of the diffusion region 120 may be flush with a lower surface of the first insulating structures 110a and 110b.

Referring to FIG. 3C, a lower surface of first insulating structures 110a' and 110b' may be higher than the lower surface of the diffusion region 120, unlike the example embodiment shown in FIG. 3B. In other words, a length of the diffusion region 120 in a third direction Z is longer than a length of the first insulating structures 110a', 110b' in the third direction Z by a first length d1.

Referring again to FIG. 3A, the gate patterns 130a and 130b may be spaced apart from each other in the first direction X. The gate patterns 130a and 130b may be, for example, dummy gates. The gate patterns 130a and 130b may be partially etched when the second insulating structure 140 is formed.

The second insulating structure 140 may be located between the gate patterns 130a and 130b. The second insulating structure 140 may be formed by, for example, forming a trench in a semiconductor substrate, or a portion of a diffusion region and the gate patterns 130a and 130b formed in the semiconductor substrate, and then filling the trench with an insulating material. The second insulating structure 140 may be referred to, for example, as a double diffusion break. The second insulating structure 140 may have a second width w2 in the first direction X. In an example embodiment, the second width w2 may be greater than the first width w1. Furthermore, in an example embodiment, the second width w2 may be greater than a width of the diffusion region 120 in the first direction X.

Referring to FIG. 3D, an upper surface of the second insulating structure 140 may be flush with the upper surface of the gate patterns 130a and 130b. In addition, a lower surface of the second insulating structure 140 may be lower than a lower surface of the gate patterns 130a and 130b. In other words, a length of the second insulating structure 140 in the third direction Z is longer than a length of the gate patterns 130a and 130b in the third direction Z by a second length d2. In an example embodiment, the length of the second insulating structure 140 in the third direction Z may be longer than a length of the first insulating structures 110a and 110b in the third direction Z.

Figure 4:
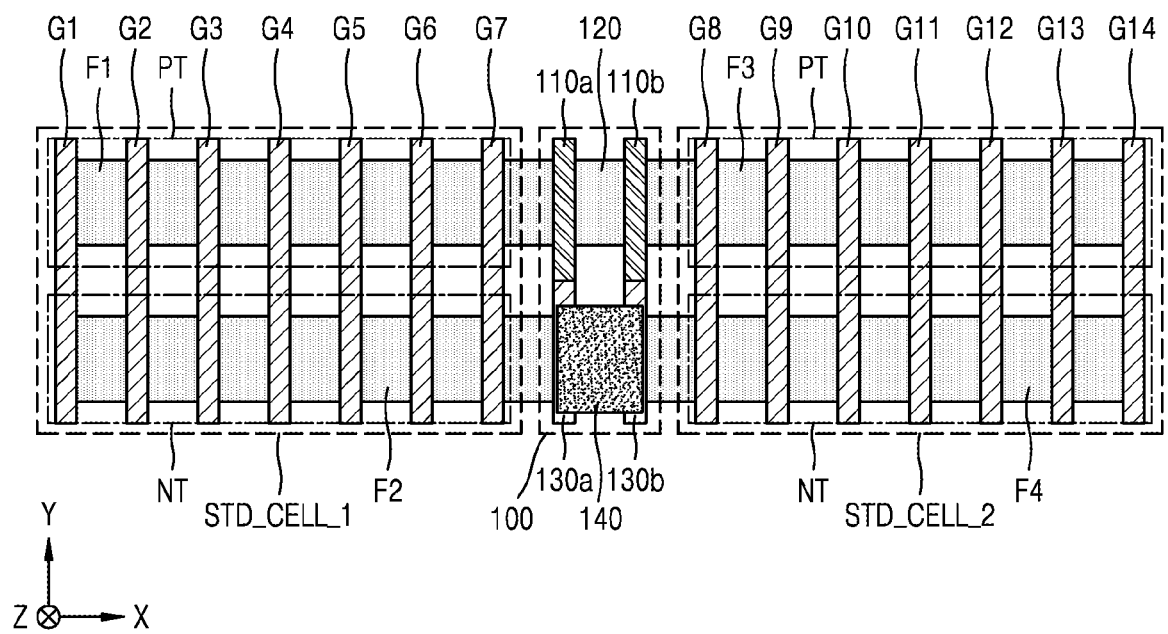
FIG. 4 is a layout of an integrated circuit according to an example embodiment of the inventive concepts.

FIG. 4 is a layout of an integrated circuit according to an example embodiment of the inventive concepts.

Referring to FIG. 4, the first standard cell STD_CELL_1 may include a first diffusion region F1 and a second diffusion region F2 extending in the first direction X. The first diffusion region F1 and the second diffusion region F2 may extend in the first direction X and may be arranged in parallel with each other. The first diffusion region F1 and the second diffusion region F2 may be spaced apart from each other in the second direction Y and may have different conductivities from each other. The first diffusion region F1 and the second diffusion region F2 may be referred to as active regions. Although not shown, fins extending in the first direction X may be arranged in the first and second diffusion regions F1 and F2.

Furthermore, the first standard cell STD_CELL_1 may include a plurality of gate patterns G1, G2, G3, G4, G5, G6, and G7 extending in the second direction Y across the first and second diffusion regions F1 and F2. For example, the plurality of gate patterns G1 to G7 may be one of a gate electrode and a dummy gate.

The first diffusion region F1 and a portion of the plurality of gate patterns G1 to G7 crossing the first diffusion region F1 may form a P-type FinFET region PT. Furthermore, the second diffusion region F2 and a portion of the plurality of gate patterns G1 to G7 crossing the second diffusion region F2 may form a P-type FinFET region PT.

The second standard cell STD_CELL_2 may include a third diffusion region F3 and a fourth diffusion region F4 extending in the first direction X. The third diffusion region F3 and the fourth diffusion region F4 may extend in the first direction X and may be arranged in parallel with each other. The third diffusion region F3 and the fourth diffusion region F4 may be spaced apart from each other in the second direction Y and may have different conductivities from each other. The third diffusion region F3 and the fourth diffusion region F4 may be referred to as active regions. Although not shown, fins extending in the first direction X may be arranged in the third and fourth diffusion regions F3 and F4.

Furthermore, the second standard cell STD_CELL_2 may include a plurality of gate patterns G8 to G14 extending in the second direction Y across the third and fourth diffusion regions F3 and F4. For example, the plurality of gate patterns G8 to G14 may be one of a gate electrode and a dummy gate.

The third diffusion region F3 and a portion of the plurality of gate patterns G8 to G14 crossing the third diffusion region F3 may form the P-type FinFET region PT. Furthermore, the fourth diffusion region F4 and a portion of the plurality of gate patterns G8 to G14 crossing the fourth diffusion region F4 may form the N-type FinFET region NT.

The filler cell 100 may be located between the first standard cell STD_CELL_1 and the second standard cell STD_CELL_2. In an example embodiment, the first insulating structures 110a and 110b and the diffusion region 120 included in the filler cell 100 may be adjacent to the P-type FinFET region PT in the first direction X. In other words, the first insulating structures 110a and 110b and the diffusion region 120 may be located between the P-type FinFET regions PT included in the first standard cell STD_CELL_1 and the second standard cell STD_CELL_2, respectively. The diffusion region 120 may overlap with the first and third diffusion regions F1 and F3 in the first direction X. The diffusion region 120 may have, for example, P-type conductivity.

In an example embodiment, the gate patterns 130a and 130b and the second insulating structure 140 included in the filler cell 100 may be adjacent to the N-type FinFET region NT in the first direction X. In other words, the gate patterns 130a and 130b and the second insulating structure 140 may be located between the N-type FinFET regions NT included in the first standard cell STD_CELL_1 and the second standard cell STD_CELL_2, respectively.

In an example embodiment, the diffusion region 120 may apply stress to the P-type FinFET region PT arranged adjacent to the diffusion region 120 in the first direction X. For example, the stress applied to the P-type FinFET region PT may be compressive stress. When compressive stress is applied to the P-type FinFET region PT, threshold voltages of transistors included in the P-type FinFET region PT may decrease. Accordingly, speed of the transistors included in the P-type FinFET region PT may increase.

In an example embodiment, the second insulating structure 140 may apply stress to the N-type FinFET region NT arranged adjacent to the second insulating structure 140 in the first direction X. For example, the stress applied to the N-type FinFET region NT may be tensile stress. When tensile stress is applied to the N-type FinFET region NT, threshold voltages of transistors included in the N-type FinFET region NT may decrease. Accordingly, speed of the transistors included in the N-type FinFET region NT may increase.

Figure 5:
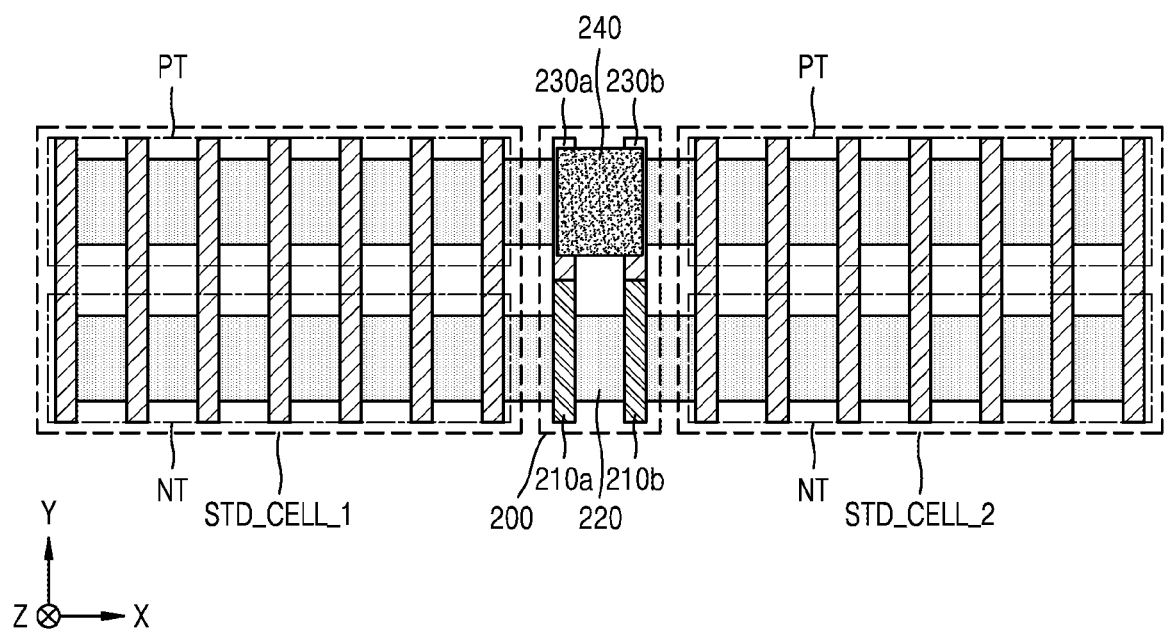
FIG. 5 is a layout of an integrated circuit according to another example embodiment of the inventive concepts.

FIG. 5 is a layout of an integrated circuit according to another example embodiment of the inventive concepts. Repeated descriptions of other configurations of the integrated circuit in comparison with FIG. 4 will not be given herein.

Referring to FIG. 5, a filler cell 200 may be located between the first standard cell STD_CELL_1 and the second standard cell STD_CELL_2. In an example embodiment, first insulating structures 210a and 210b and a diffusion region 220 included in the filler cell 200 may be adjacent to the N-type FinFET region NT in the first direction X. In other words, the first insulating structures 210a and 210b and the diffusion region 220 may be located between the N-type FinFET regions NT included in the first standard cell STD_CELL_1 and the second standard cell STD_CELL_2, respectively. The diffusion region 220 may overlap with the second and fourth diffusion regions F2 and F4 in the first direction X. The diffusion region 220 may have, for example, N-type conductivity.

In an example embodiment, gate patterns 230a and 230b and a second insulating structure 240 included in the filler cell 200 may be adjacent to the P-type FinFET region PT in the first direction X. In other words, the gate patterns 230a and 230b and the second insulating structure 240 may be located between the P-type FinFET regions PT included in the first standard cell STD_CELL_1 and the second standard cell STD_CELL_2, respectively.

In an example embodiment, the diffusion region 220 may apply stress to the N-type FinFET region NT arranged adjacent to the diffusion region 220 in the first direction X. For example, the stress applied to the N-type FinFET region NT may be compressive stress. When compressive stress is applied to the N-type FinFET region NT, threshold voltages of transistors included in the N-type FinFET region NT may increase. Accordingly, speed of the transistors included in the N-type FinFET region NT may decrease.

In an example embodiment, the second insulating structure 240 may apply stress to the P-type FinFET region PT arranged adjacent to the second insulating structure 240 in the first direction X. For example, the stress applied to the P-type FinFET region PT may be tensile stress. When tensile stress is applied to the P-type FinFET region PT, threshold voltages of transistors included in the P-type FinFET region PT may increase. Accordingly, speed of the transistors included in the P-type FinFET region PT may decrease.

An integrated circuit according to the inventive concepts may enable selective speed control of cells including transistors by arranging filler cells. Further, filler cells included in the integrated circuit according to example embodiments of the inventive concepts may ensure autonomy at the point of application, which can be applied to any stage of integrated circuit design.

Figure 6:
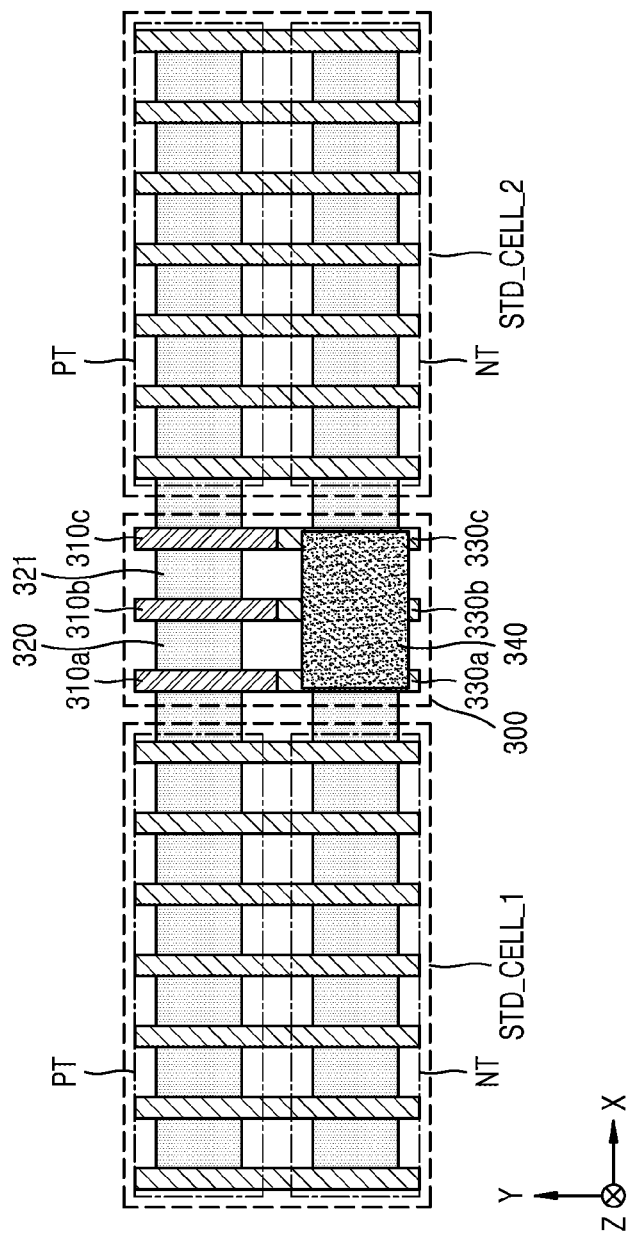
FIG. 6 is a layout of an integrated circuit according to an example embodiment of the inventive concepts.

FIG. 6 is a layout of an integrated circuit according to an example embodiment of the inventive concepts. Repeated descriptions of other configurations of the integrated circuit in comparison with FIG. 4 will not be given herein.

Referring to FIG. 6, a filler cell 300 may include first insulating structures 310a, 310b, and 310c, a fifth diffusion region 320, and a sixth diffusion region 321. In addition, the filler cell 300 may include gate patterns 330a, 330b, and 330c and a second insulating structure 340.

In an example embodiment, the first insulating structures 310a to 310c, the fifth diffusion region 320, and the sixth diffusion region 321 may be adjacent to the P-type FinFET region PT in the first direction X. In other words, the first insulating structures 310a to 310c, the fifth diffusion region 320, and the sixth diffusion region 321 may be located between the P-type FinFET regions PT included in the first standard cell STD_CELL_1 and the second standard cell STD_CELL_2, respectively. The fifth and sixth diffusion regions 320 and 321 may overlap with the first and third diffusion regions F1 and F3 in the first direction X. The fifth diffusion region 320 and/or the sixth diffusion region 321 may have, for example, P-type conductivity.

In an example embodiment, the gate patterns 330a to 330c and the second insulating structure 340 may be located adjacent the N-type FinFET region NT in the first direction X. In other words, the gate patterns 330a to 330c and the second insulating structure 340 may be located between the N-type FinFET regions NT included in the first standard cell STD_CELL_1 and the second standard cell STD_CELL_2, respectively.

Figure 7:
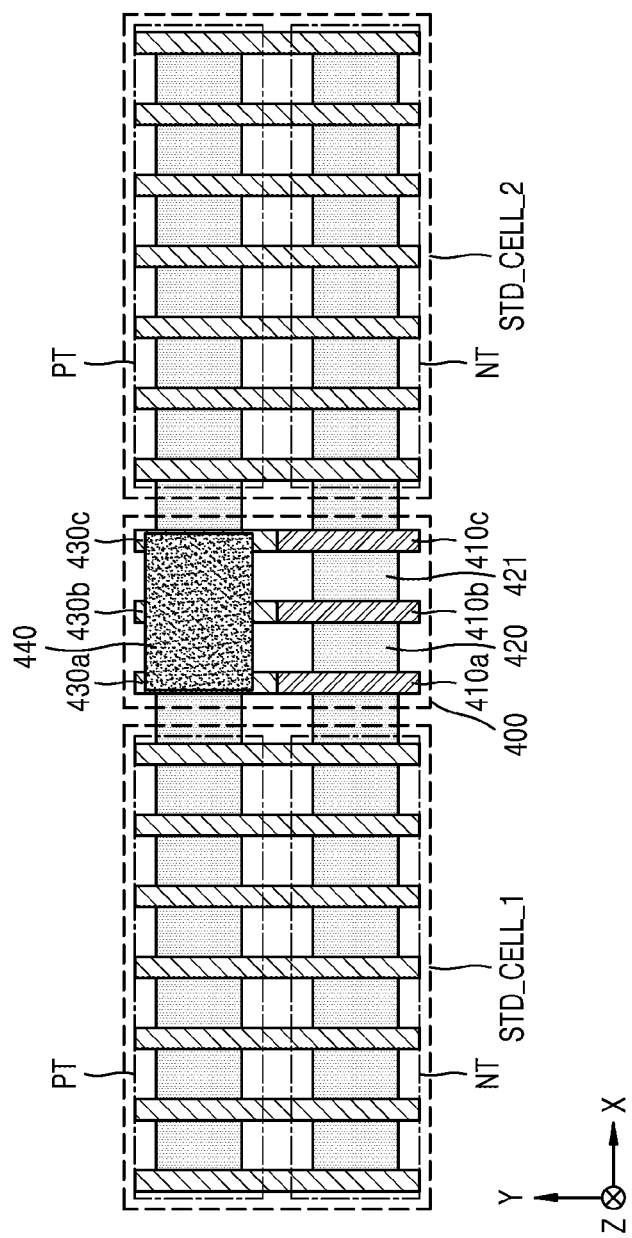
FIG. 7 is a layout of an integrated circuit according to an example embodiment of the inventive concepts.

FIG. 7 is a layout of an integrated circuit according to an example embodiment of the inventive concepts. Repeated descriptions of other configurations of the integrated circuit in comparison with FIG. 6 will not be given herein.

Referring to FIG. 7, first insulating structures 410a, 410b, and 410c, a fifth diffusion region 420, and a sixth diffusion region 421 may be adjacent to the N-type FinFET region NT in the first direction X. In other words, the first insulating structures 410a to 410c, the fifth diffusion region 420, and the sixth diffusion region 421 may be located between the N-type FinFET regions NT included in the first standard cell STD_CELL_1 and the second standard cell STD_CELL_2, respectively. The fifth and sixth diffusion regions 420 and 421 may overlap with the second and fourth diffusion regions F2 and F4 in the first direction X. The fifth diffusion region 420 and/or the sixth diffusion region 421 may have, for example, N-type conductivity.

In an example embodiment, the gate patterns 430a to 430c and the second insulating structure 440 may be located adjacent the P-type FinFET region PT in the first direction X. In other words, the gate patterns 430a to 430c and the second insulating structure 440 may be located between the P-type FinFET regions PT included in the first standard cell STD_CELL_1 and the second standard cell STD_CELL_2, respectively.

Figure 8:
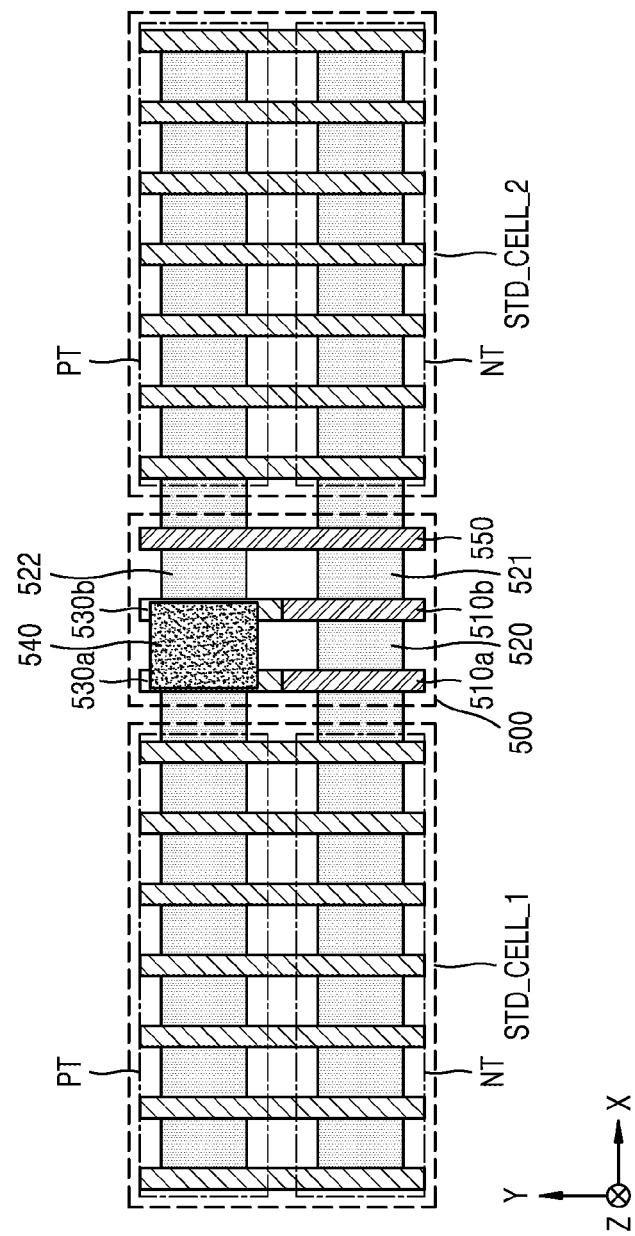
FIG. 8 is a layout of an integrated circuit according to another example embodiment of the inventive concepts.

FIG. 8 is a layout of an integrated circuit according to another example embodiment of the inventive concepts. Repeated descriptions of other configurations of the integrated circuit in comparison with FIG. 4 will not be given herein.

Referring to FIG. 8, a filler cell 500 may include first insulating structures 510a and 510b, a fifth diffusion region 520, a sixth diffusion region 521, and a seventh diffusion region 522. In addition, the filler cell 500 may include gate patterns 530a and 530b and a second insulating structure 540. In addition, the filler cell 500 may include a third insulating structure 555.

For example, when the first insulating structures 510a and 510b and the fifth diffusion region 520 form the first region A1 (of FIG. 5A), and the gate patterns 530a and 530b and the second insulating structure 540 form the second region A2 (of FIG. 5A), the sixth diffusive region 521, the seventh diffusion region 522, and the third insulating structure 550 may form a third region. The third insulating structure 550 may include, but not limited to, materials such as the first insulating structures 510a and 510b.

In an example embodiment, the first insulating structures 510a and 510b, the fifth diffusion region 520, the sixth diffusion region 521, and a portion of the third insulating structure 555 may be adjacent to the N-type FinFET region NT in the first direction X. In other words, the first insulating structures 510a and 510b, the fifth diffusion region 520, the sixth diffusion region 521, and a portion of the third insulating structure 555 may be located between the N-type FinFET regions NT included in the first standard cell STD_CELL_1 and the second standard cell STD_CELL_2, respectively. The fifth and sixth diffusion regions 520 and 521 may overlap with the second and fourth diffusion regions F2 and F4 in the first direction X. The fifth diffusion region 520 and/or the sixth diffusion region 521 may have, for example, N-type conductivity.

In an example embodiment, the gate patterns 530a and 530b, the second insulating structure 540, the seventh diffusion region 522, and a portion of the third insulating structure 555 may be adjacent to the P-type FinFET region PT in the first direction X. In other words, the gate patterns 530a and 530b, the second insulating structure 540, the seventh diffused region 522, and a portion of the third insulating structure 555 may be located between the P-type FinFET regions PT included in the first standard cell STD_CELL_1 and the second standard cell STD_CELL_2, respectively. The seventh diffusion region 522 may overlap with the first and third diffusion regions F1 and F3 in the first direction X. The seventh diffusion region 522 may have, for example, P-type conductivity.

In an example embodiment, the fifth diffusion region 520 may apply stress to the N-type FinFET region NT of the first standard cell STD_CELL_1 arranged adjacent to the fifth diffusion region 520 in the first direction X. For example, the stress applied to the N-type FinFET region NT of the first standard cell STD_CELL_1 may be compressive stress. Furthermore, in an example embodiment, the second insulating structure 540 may apply stress to the P-type FinFET region PT of the first standard cell STD_CELL_1 arranged adjacent to the second insulating structure 540 in the first direction X. For example, the stress applied to the P-type FinFET region PT of the first standard cell STD_CELL_1 may be tensile stress.

In an example embodiment, the sixth diffusion region 521 may apply stress to the N-type FinFET region NT of the second standard cell STD_CELL_2 arranged adjacent to the sixth diffusion region 521 in the first direction X. For example, the stress applied to the N-type FinFET region NT of the second standard cell STD_CELL_2 may be compressive stress.

Furthermore, in an example embodiment, the seventh diffusion region 522 may apply stress to the P-type FinFET region PT of the second standard cell STD_CELL_2 arranged adjacent to the seventh diffusion region 522 in the first direction X. For example, the stress applied to the P-type FinFET region PT of the second standard cell STD_CELL_2 may be compressive stress. When compressive stress is applied to the P-type FinFET region PT, threshold voltages of transistors included in the P-type FinFET region PT may decrease. Furthermore, when compressive stress is applied to the N-type FinFET region NT, threshold voltages of transistors included in the N-type FinFET region NT may increase. Therefore, speed change due to stress of the second standard cell STD_CELL_2 may be less than speed change due to stress of the first standard cell STD_CELL_1.

Figure 9:
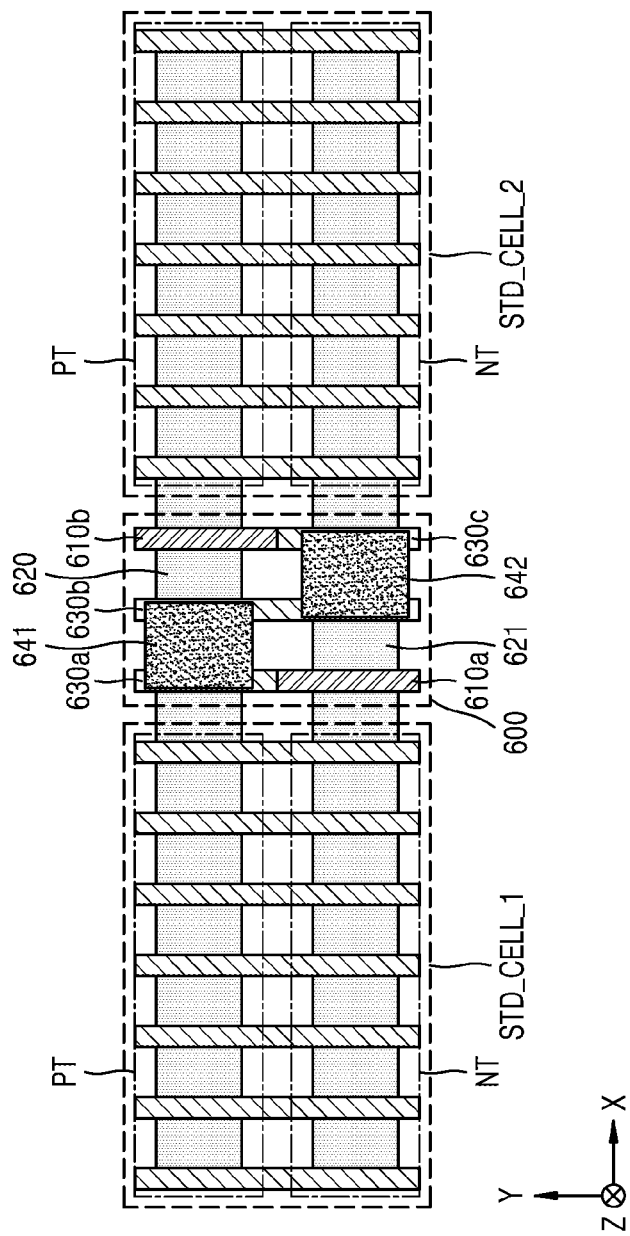
FIG. 9 is a layout of an integrated circuit according to another example embodiment of the inventive concepts.

FIG. 9 is a layout of an integrated circuit according to another example embodiment of the inventive concepts. Repeated descriptions of other configurations of the integrated circuit in comparison with FIG. 4 will not be given herein.

Referring to FIG. 9, a filler cell 600 may include first insulating structures 610a and 610b, a fifth diffusion region 620, and a sixth diffusion region 621. In addition, the filler cell 300 may include first, second and third gate patterns 630a, 630b, and 630c, and may also include second insulating structures 641 and 642.

In an example embodiment, the first gate pattern 630a, the second insulating structure 641, a portion of the second gate pattern 630b, the fifth diffusion region 620, and the first insulating structure 610b may be adjacent to the P-type FinFET region PT in the first direction X. In other words, the first gate pattern 630a, the second insulating structure 641, a portion of the second gate pattern 630b, the fifth diffusion region 620, and the first insulating structure 610b may be located between the P-type FinFET regions PT included in the first standard cell STD_CELL_1 and the second standard cell STD_CELL_2, respectively. The fifth diffusion region 620 may overlap with the first and third diffusion regions F1 and F3 in the first direction X. The fifth diffusion region 620 may have, for example, P-type conductivity.

In an example embodiment, the first insulating structure 610a, the sixth diffusion region 621, a portion of the second gate pattern 630b, the second insulating structure 642, and the third gate pattern 630c may be adjacent to the N-type FinFET region NT in the first direction X. In other words, the first insulating structure 610a, the sixth diffusion region 621, a portion of the second gate pattern 630b, the second insulating structure 642, and the third gate pattern 630c may be located between the N-type FinFET regions NT included in the first standard cell STD_CELL_1 and the second standard cell STD_CELL_2, respectively. The sixth diffusion region 621 may overlap with the second and fourth diffusion regions F2 and F4 in the first direction X. The sixth diffusion region 621 may have, for example, N-type conductivity.

In an example embodiment, the second insulating structure 641 may apply stress to the P-type FinFET region PT of the first standard cell STD_CELL_1 arranged adjacent to the second insulating structure 641 in the first direction X. For example, the stress applied to the P-type FinFET region PT of the first standard cell STD_CELL_1 may be tensile stress. In an example embodiment, the sixth diffusion region 621 may apply stress to the N-type FinFET region NT of the first standard cell STD_CELL_1 arranged adjacent to the sixth diffusion region 621 in the first direction X. For example, the stress applied to the N-type FinFET region NT of the first standard cell STD_CELL_1 may be compressive stress. Accordingly, speed of the first standard cell STD_CELL_1 may decrease due to the stress.

In an example embodiment, the fifth diffusion region 620 may apply stress to the P-type FinFET region PT of the second standard cell STD_CELL_2 arranged adjacent to the fifth diffusion region 620 in the first direction X. For example, the stress applied to the P-type FinFET region PT of the second standard cell STD_CELL_2 may be compressive stress. Furthermore, in an example embodiment, the second insulating structure 642 may apply stress to the N-type FinFET region NT of the second standard cell STD_CELL_2 arranged adjacent to the second insulating structure 642 in the first direction X. For example, the stress applied to the N-type FinFET region NT of the second standard cell STD_CELL_2 may be tensile stress. Accordingly, speed of the second standard cell STD_CELL_2 may increase due to the stress.

Figure 10:
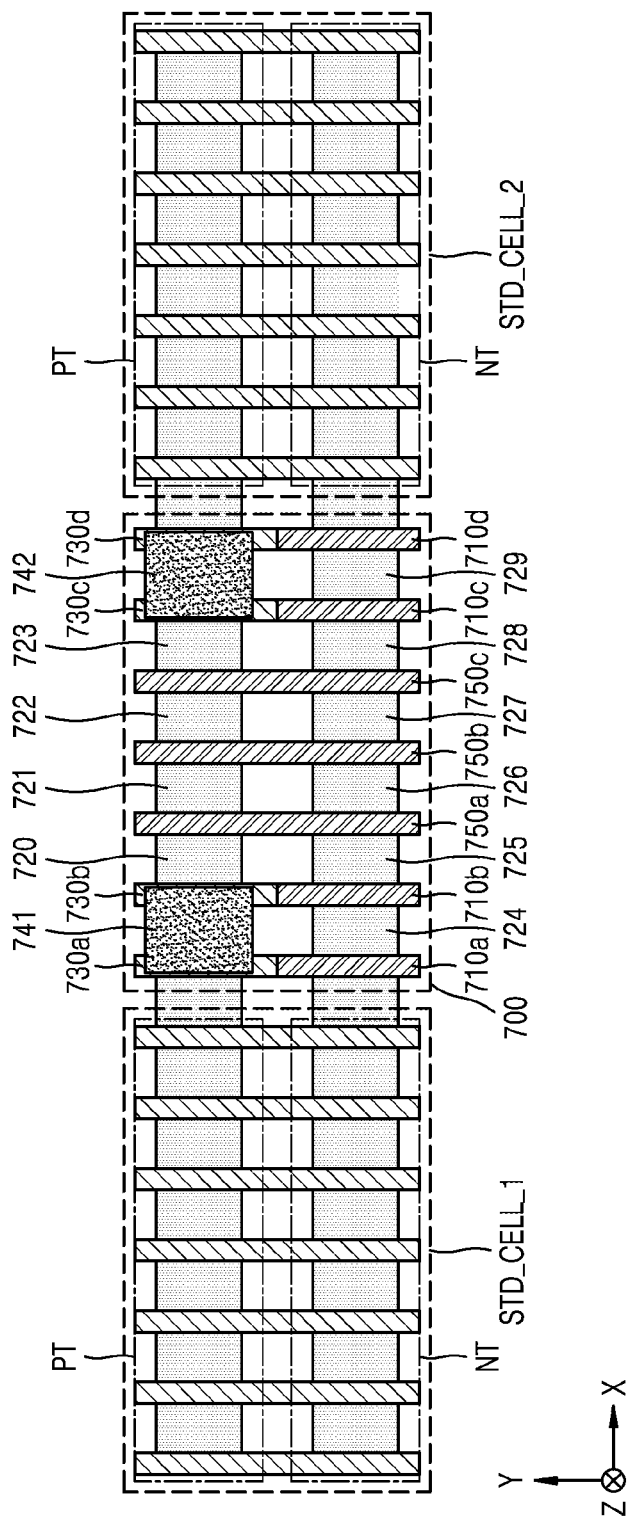
FIG. 10 is a layout of an integrated circuit according to another example embodiment of the inventive concepts.

FIG. 10 is a layout of an integrated circuit according to another example embodiment of the inventive concepts. Repeated descriptions of other configurations of the integrated circuit in comparison with FIG. 4 will not be given herein.

Referring to FIG. 10, a filler cell 700 may include first insulating structures 710a to 710d, fifth to 14th fins 720 to 729, gate patterns 730a, 730b, 730c, and 730d, and second insulating structures 741 and 742. In addition, the filler cell 700 may include third insulating structures 750a to 750c.

For example, when the first insulating structures 710a to 710d, the ninth diffusion region 724, and the fourteenth diffusion region 729 form the first region A1 (of FIG. 5A), and the gate patterns 730a to 730d and the second insulating structures 741 and 742 form the second region A2 (of FIG. 5A), the third insulating structures 750a to 750c, the fifth to eighth diffusion regions 720 to 723, and the 10th to 13th diffusion regions 725 to 728 may form a third region. The third insulating structures 750a to 750c may include, but not limited to, materials such as the first insulating structures 710a to 710d.

In an example embodiment, some of the first insulating structures 710a to 710d and third insulating structures 750a, 750b, 750c, and 750d, and the ninth to 14th diffusion regions 724 to 729 may be adjacent to the N-type FinFET region NT in the first direction X. In other words, some of the first insulating structures 710a to 710d and the third insulating structures 750a to 750d, and the ninth to 14th diffusion regions 724 to 729 may be located between the N-type FinFET regions NT included in the first standard cell STD_CELL_1 and the second standard cell STD_CELL_2, respectively. The ninth to 14th diffusion regions 724 to 729 may overlap with the second and fourth diffusion regions F2 and F4 in the first direction X. The ninth to fourteenth diffusion regions 724 to 729 may have, for example, N-type conductivity.

In an example embodiment, some of the gate patterns 730a to 730d, the second insulating structures 741 and 742, and the third insulating structures 750a to 750d, and the fifth to eighth diffusion regions 720 to 723 may be adjacent to the P-type FinFET region PT in the first direction X. In other words, some of the gate patterns 730a to 730d, the second insulating structures 741 and 742, and the third insulating structures 750a to 750d, and the fifth to eighth diffusion regions 720 to 723 may be located between the P-type FinFET regions PT included in the first standard cell STD_CELL_1 and the second standard cell STD_CELL_2, respectively. The fifth to eighth diffusion regions 720 to 723 may overlap with the first and third diffusion regions F1 and F3 in the first direction X. The fifth to eighth diffusion regions 720 to 723 may have, for example, P-type conductivity.

Figure 11:
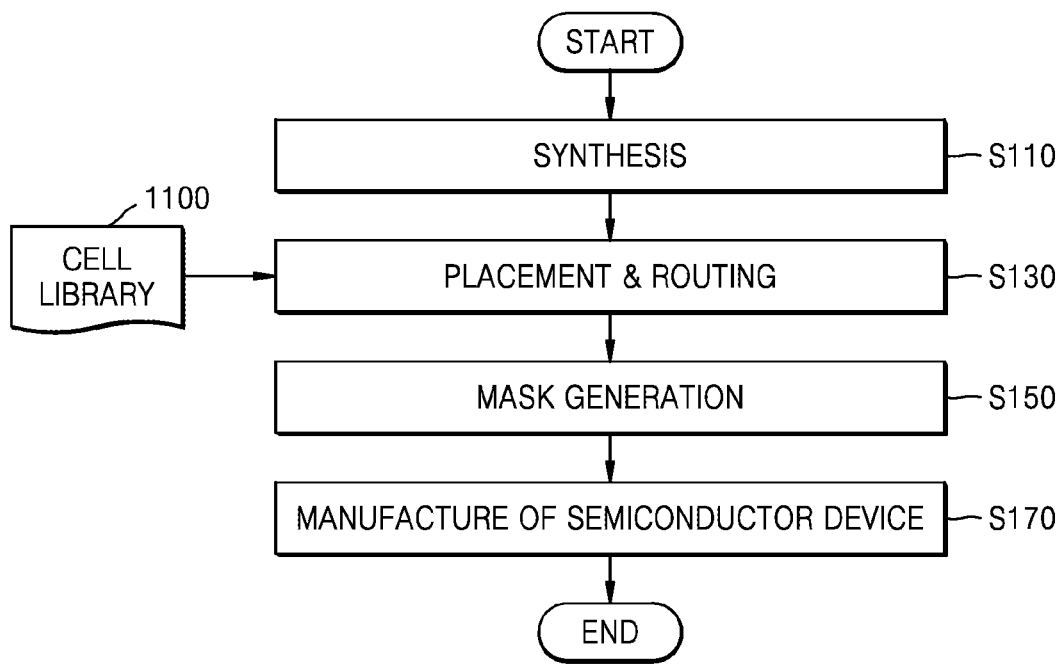
FIG. 11 is a flowchart illustrating a method of manufacturing a semiconductor device according to an example embodiment of the inventive concepts.

FIG. 11 is a flowchart illustrating a method of manufacturing a semiconductor device according to an example embodiment of the inventive concepts.

Referring to FIG. 11, a method of manufacturing the semiconductor device may be classified into a design process and a manufacturing process of an integrated circuit. The design process of the integrated circuit includes operations S110 and S130, and the manufacturing process of the integrated circuit includes operations S150 and S170, and may be performed in a semiconductor process module as an operation of manufacturing the semiconductor device according to the integrated circuit based on layout data.

In operation S110, a synthesis operation is performed. For example, in operation S110, the processor 48 may perform the synthesis operation using a synthesis tool. In more detail, the processor 48 may generate a netlist of a gate level by synthesizing input data defined in a Register Transfer Level (RTL) with the integrated circuit using a standard cell library.

In operation S130, layout data for the integrated circuit is generated by placing and routing standard cells that define the integrated circuit according to the netlist. For example, in operation S130, the processor 48 may use a Placement & Routing (P&R) tool to generate the layout data. For example, the layout data may have a Graphic Design System (GDS) II format. In more detail, as illustrated in FIGS. 1 to 10, the layout data may be generated by placing a first region including a plurality of first insulating structures in a filler cell design arranged adjacent to a standard cell, and a second region including a second insulating structure having a width greater than those of the first insulating structures. After operation S130, a parasitic component extraction operation, an STA operation, and the like may be further included.

In operation S150, a mask is generated based on the layout data. In more detail, an Optical Proximity Correction (OPC) may be performed based on the layout data. Then, the mask may be manufactured according to the changed layout according to a result of the OPC. Here, it is possible to manufacture a mask using a layout reflecting the OPC, for example, a Graphic Data System (GDS) II to which the OPC is applied.

In operation S170, the semiconductor device, in which the integrated circuit is implemented, is manufactured using the mask. In more detail, various semiconductor processes are performed on a semiconductor substrate such as a wafer using a plurality of masks to form the semiconductor device in which the integrated circuit is implemented. For example, a process using a mask may refer to a patterning process through a lithography process. Through such a patterning process, a desired pattern may be formed on a semiconductor substrate or a material layer. Meanwhile, the semiconductor processes may include a deposition process, an etching process, an ion process, a cleaning process, and the like. In addition, the semiconductor process may include a packaging process for mounting the semiconductor device on a printed circuit board (PCB) and sealing it with a sealing material, and may include a test process for testing the semiconductor device or a package.

Figure 12:
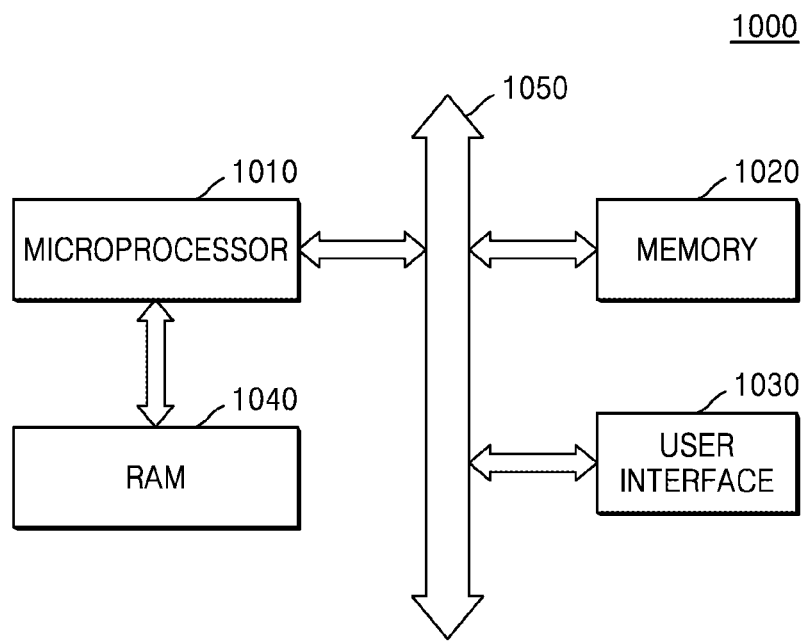
FIG. 12 is a block diagram of an electronic system including a semiconductor device according to an example embodiment of the inventive concepts.

FIG. 12 is a block diagram of an electronic system 1000 including a semiconductor device according to an example embodiment of the inventive concepts.

Referring to FIG. 12, the electronic system 1000 according to an example embodiment of the inventive concepts may include a microprocessor 1010, a memory system 1020, and a user interface 1030 that perform data communication via a bus 1050. Furthermore, the electronic system 1000 may further include Random-Access Memory (RAM) 1040 that may communicate directly or indirectly with the microprocessor 1010. For example, the microprocessor 1010 and/or RAM 1040 may be assembled into a single package.

The microprocessor 1010 may include, for example, a Central Processing Unit (CPU) or an Application Processor (AP). The user interface 1030 may be used to input or output information to/from the electronic system 1000. For example, the user interface 1030 may include a touch pad, a touch screen, a keyboard, a mouse, a scanner, an audio director, a Cathode Ray Tube (CRT) monitor, a liquid crystal display (LCD), an Active Matrix Organic Light-Emitting Diode (AMOLED), a plasma display panel (PDP).

The memory system 1020 may store codes for an operation of the microprocessor 1010, data processed by the microprocessor 1010, or external input data. The memory system 1020 may include a memory controller, a hard disk, or a solid state drive (SSD). The microprocessor 1010, the RAM 1040, and/or the memory system 1020 may include a semiconductor device designed by the layout design system 40 according to the inventive concepts.

While the inventive concepts have been particularly shown and described with reference to example embodiments thereof, it will be understood that various changes in form and details may be made therein without departing from the spirit and scope of the following claims.

What is claimed is:

1. An integrated circuit comprising:
a first standard cell including a P-type Fin Field Effect Transistor (FinFET) region and an N-type FinFET region; and
a filler cell adjacent to the first standard cell in a first direction, the filler cell including a first region and a second region arranged in a second direction, the second direction being perpendicular to the first direction, a first one of the first region and the second region being adjacent to the P-type FinFET region in the first direction and a second one of the first region and the second region being adjacent to the N-type FinFET region in the first direction, the first region including a plurality of first insulating structures spaced apart from each other in the first direction, and the second region includes a second insulating structure, a width of the second insulating structure in the first direction being greater than a width at least one of the plurality of first insulating structures in the first direction.

2. The integrated circuit of claim 1, wherein the first region includes a diffusion region between the plurality of first insulating structures.

3. The integrated circuit of claim 2, wherein an upper surface of the diffusion region is flush with an upper surface of at least one of the plurality of first insulating structures.

4. The integrated circuit of claim 2, wherein the width of the second insulating structure is greater than a width of the diffusion region in the first direction.

5. The integrated circuit of claim 1, wherein
at least one of the plurality of first insulating structures has a first length in a third direction, the third direction being perpendicular to both the first direction and the second direction, and
the second insulating structure has a second length in the third direction, the second length of the second insulating structure being greater than the first length of the at least one of the plurality of first insulating structures.

6. The integrated circuit of claim 1, wherein
the first region is adjacent to the P-type FinFET region in the first direction, and
the second region is adjacent to the N-type FinFET region in the first direction.

7. The integrated circuit of claim 1, wherein
the first region is adjacent to the N-type FinFET region in the first direction, and
the second region is adjacent to the P-type FinFET region in the first direction.

8. The integrated circuit of claim 1, further comprising:
a second standard cell spaced apart from the first standard cell in the first direction with the filler cell interposed therebetween, wherein
the filler cell further includes a third region between the first region and the second region and the second standard cell such that the first region and the second region are on a first side of the third region, and the second standard cell is on a second side of the third region, the third region including a third insulating structure extending in the second direction, the third insulating structure being spaced apart from the second insulating structure in the first direction.

9. The integrated circuit of claim 8, wherein the third region is configured to arrange a diffusion region in at least one of (i) between the first region and the third insulating structure and (ii) between the second region and the third insulating structure.

10. An integrated circuit comprising:
a first standard cell including a P-type Fin Field Effect Transistor (FinFET) region and an N-type FinFET region; and
a filler cell adjacent to the first standard cell in a first direction, the filler cell including a first region and a second region arranged in a second direction, the second direction being perpendicular to the first direction, wherein
a first one of the first region and the second region includes a diffusion region, and
a second one of the first region and the second region, which does not include the diffusion region, includes an insulating structure having a width greater than a width of the diffusion region in at least one of the first direction and the second direction.

11. The integrated circuit of claim 10, wherein
the first region is adjacent to the P-type FinFET region in the first direction, and
the second region is adjacent to the N-type FinFET region in the first direction.

12. The integrated circuit of claim 10, wherein the first one of the first region and the second region, which includes the diffusion region, comprises:
a plurality of first insulating structures spaced apart from each other in the first direction with the diffusion region interposed therebetween.

13. The integrated circuit of claim 12, wherein
an upper surface of the diffusion region is flush with an upper surface of at least one of the plurality of first insulating structures.

14. The integrated circuit of claim 12, wherein the width of the insulating structure is greater than the width of the diffusion region in the first direction and the second direction.

15. The integrated circuit of claim 14, wherein a lower surface of the diffusion region is flush with or higher than a lower surface of the plurality of first insulating structures with respect to a substrate.

16. An integrated circuit comprising:
a first cell including a first diffusion region, a second diffusion region and a plurality of gate patterns, the first diffusion region and the second diffusion region extending in a first direction, the second diffusion region being spaced apart from the first diffusion region in a second direction, the second direction being perpendicular to the first direction, the plurality of gate patterns extending in the second direction across the first diffusion region and the second diffusion region; and
a filler cell adjacent to the first cell in the first direction, the filler cell including a first region and a second region arranged along the second direction, the first region including a plurality of first insulating structures spaced apart from each other in the first direction, and the second region including a second insulating structure, a width of the second insulating structure being greater than a width of at least one of the plurality of first insulating structures.

17. The integrated circuit of claim 16, wherein the first region includes a third diffusion region between the plurality of first insulating structures.

18. The integrated circuit of claim 17, wherein the third diffusion region is configured to overlap with the first diffusion region in the first direction.

19. The integrated circuit of claim 17, wherein the third diffusion region is configured to overlap with the second diffusion region in the first direction.

20. The integrated circuit of claim 17, wherein the width of the second insulating structure is greater than a width of the third diffusion region in the first direction.

* * * * *